(12) United States Patent
Sengupta et al.

(10) Patent No.: US 10,592,802 B2
(45) Date of Patent: Mar. 17, 2020

(54) ELECTRONIC SYNAPSE HAVING SPIN-ORBIT TORQUE INDUCED SPIKE-TIMING DEPENDENT PLASTICITY

(71) Applicant: Purdue Research Foundation, West Lafayette, IN (US)

(72) Inventors: Abhronil Sengupta, West Lafayette, IN (US); Zubair Al Azim, West Lafayette, IN (US); Xuanyao Kelvin Fong, West Lafayette, IN (US); Kaushik Roy, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 556 days.

(21) Appl. No.: 15/445,945

(22) Filed: Feb. 28, 2017

(65) Prior Publication Data
US 2017/0249550 A1 Aug. 31, 2017

Related U.S. Application Data (60) Provisional application No. 62/300,863, filed on Feb. 28, 2016.

(51) Int. Cl.
*G06N 3/04* (2006.01)
*H01L 43/08* (2006.01)
*G06N 3/063* (2006.01)
*G06N 3/08* (2006.01)

(52) U.S. Cl.
CPC ........... *G06N 3/049* (2013.01); *G06N 3/0635* (2013.01); *G06N 3/088* (2013.01); *H01L 43/08* (2013.01)

(58) Field of Classification Search
CPC ...... G06N 3/049; G06N 3/0635; G06N 3/088; H01L 43/08
See application file for complete search history.

(56) References Cited

U.S. PATENT DOCUMENTS

| | | | |
|---|---|---|---|
| 2014/0301136 A1* | 10/2014 | Inokuchi | G11C 11/161 365/158 |
| 2015/0200003 A1* | 7/2015 | Buhrman | G11C 11/18 365/158 |
| 2017/0178705 A1* | 6/2017 | Buhrman | H01L 43/08 |

(Continued)

OTHER PUBLICATIONS

"IBM Unveils a New Brain Simulator", IEEE Spectrum, 2009, pp. 2.

(Continued)

*Primary Examiner* — Kakali Chaki
*Assistant Examiner* — Vasyl Dykyy
(74) *Attorney, Agent, or Firm* — Purdue Research Foundation (57) ABSTRACT

An electronic synapse is disclosed, comprising a heavy metal layer having a high spin orbit coupling, a domain wall magnet layer having a bottom surface adjacent to a top surface of the heavy metal layer, the domain wall magnet layer having a perpendicular magnetic anisotropy, the domain wall magnet layer having a domain wall, the domain wall running parallel to a longitudinal axis of the domain wall magnet layer, a pinned layer having perpendicular magnetic anisotropy, and an oxide tunnel barrier connected between the domain wall magnet layer and the pinned layer, wherein the pinned layer, the oxide tunnel barrier, and the free layer form a magnetic tunnel junction.

3 Claims, 10 Drawing Sheets

(56) References Cited

U.S. PATENT DOCUMENTS

2018/0240964 A1* 8/2018 Nikonov ............... H01L 43/08

OTHER PUBLICATIONS

Hebb, D., "The Organization of Behavior", Wiley: New York, 1949, pp. 437.

Guo-Qiang, B., et al., "Synaptic Modifications in Cultured Hippocampal Neurons: Dependence on Spike Timing, Synaptic Strength, and Postsynaptic Cell Type", The Journal of Neuroscience, 18, 24, 1998, pp. 10464-10472.

Merolla, P., et al., "A Digital Neurosynaptic Core Using Embedded Crossbar Memory with 45pJ per Spike in 45nm", IEEE, 2011, pp. 1-4.

Seo, J., et al., "A 45nm CMOS Neuromorphic Chip with a ScalableArchitecture for Learning in Networks of Spiking Neurons", IEEE, 2011, pp. 4.

Jackson, B., et al., "Nanoscale Electronic Synapses Using Phase Change Devices", ACM, 9, 2, 2013, pp. 12:1-12:20.

Kuzum, D., et al., "Nanoelectronic Programmable Synapses Based on Phase Change Materials for Brain-Inspired Computing", Nano Letters, 12, 2012, pp. 2179-2186.

Jo, S., et al., "Nanoscale Memristor Device as Synapse in Neuromorphic Systems", Nano Letters, 10, 2010, pp. 1297-1301.

Li, Y., et al., "Ultrafast Synaptic Events in a Chalcogenide Memristor" Scientific Reports, 3, 1619, 2013, pp. 7.

Indiveri, G., et al., "Integration of nanoscale memristor synapses in neuromorphic computing architectures", Nanotechnology, 24, 384010, 2013, pp. 13.

Serrano-Gotarredona, T., et al., "A Proposal for Hybrid Memristor-CMOS Spiking Neuromorphic Learning Systems", IEEE, 13, 74, 2013, pp. 74-88.

Rajendran, B., et al., "Specifications of Nanoscale Devices and Circuits for Neuromorphic Computational Systems", IEEE, 60, 1, 2013, pp. 246-253.

Wang, X., et al., "Spintronic Memristor Through Spin-Torque-Induced Magnetization Motion", IEEE, 30, 3, 2009, pp. 294-297.

Wang, X., et al., "Spintronic Memristor Temperature Sensor", IEEE, 31, 1, 2010, pp. 20-22.

Hirsch, J., "Spin Hall Effect", Physical Review Letters, 83, 9, 1999, pp. 1834-1837.

Liu, L, et al., "Spin-Torque Switching with the Giant Spin Hall Effect of Tantalum", Science, 336, 2012, pp. 555-558.

Bhowmik, D., et al., "Deterministic Domain Wall Motion Orthogonal to Current Flow Due to Spin Orbit Torque", Nature, Scientific Reports, pp. 10.

Fong, X., et al., "KNACK: A Hybrid Spin-Charge Mixed-Mode Simulator for Evaluating Different Genres of Spin-Transfer Torque MRAM Bit-cells", IEEE, 51, 2011, pp. 51-54.

Slonczewski, J., "Conductance and exchange coupling of two ferromagnets separated by a tunneling barrier", Physical Review B, 39, 10, 1989, pp. 6995-7002.

Martinez, E., et al., "Current-driven domain wall motion along high perpendicular anisotropy multilayers: the role of the Rashba field, the spin Hall effect, and the Dzyaloshinskii-Moriya interaction", Applied Physics Letters, 103, 2013, pp. 072406-1-072406-5.

Vansteenkiste, et al., "The design and verification of MuMax3", AIP Advances, 4, 2014, pp. 107133-1-107133-22.

Emori, S., et al., "Current-driven dynamics of chiral ferromagnetic domain walls" Nature Materials, 12, 2013, pp. 611-616.

Augustine, C., et al., "Ultra-Low Power Nanomagnet-Based Computing: A System-Level Perspective", IEEE, 10, 4, 2011, pp. 778-788.

\* cited by examiner

ELECTRONIC SYNAPSE HAVING SPIN-ORBIT TORQUE INDUCED SPIKE-TIMING DEPENDENT PLASTICITY

CROSS-REFERENCE TO RELATED APPLICATIONS

The present patent application is related to and claims the priority benefit of U.S. Provisional Patent Application Ser. No. 62/300,863, filed Feb. 28, 2016, the contents of which is hereby incorporated by reference in its entirety into the present disclosure.

TECHNICAL FIELD

The present application relates to artificial neural networks, and more specifically, to an electronic synapse having spin-orbit torque induced spike-timing dependent plasticity.

BACKGROUND

Large scale cortical brain simulations on present day supercomputers, based on the Von-Neumann model of computation, have proved highly inefficient with respect to the ultra-high density and energy efficient processing capability of the human brain. For instance, the IBM Blue Gene supercomputer consumed 1.4 MW of power to simulate 5 seconds of brain activity of a cat. On the contrary, the human brain consumes power of the order of a few Watts. In order to harness the remarkable efficacy of the human brain in cognition and perception related tasks, the field of neuromorphic computing attempts to develop non Von-Neumann computing models inspired by the functionality of the basic building blocks, i.e. neurons and synapses in the biological brain.

The computational fabric of the brain consists of a highly interconnected structure where neurons are connected by junctions termed as synapses. Each synapse is characterized by a conductance and helps to transmit weighted signals in the form of spikes from one neuron (the "pre-neuron") to another neuron (the "post-neuron"). It is now widely accepted that synapses are the main computational element involved in learning and cognition. The theory of Hebbian Learning postulates that the strength of synapses are modulated in accordance to the temporal relationship of the spiking patterns of the pre-neurons and post-neurons. In particular, Spike-Timing Dependent Plasticity (STDP) has emerged as one of the most popular approaches of Hebbian Learning. According to STDP, if the pre-neuron spikes before the post-neuron, the conductance of the synapse potentiates (increases), while it depresses (decreases) if the pre-neuron spikes after the post-neuron. The relative change in synaptic strength decreases exponentially with the timing difference between the pre-neuron and post-neuron spikes. The timing window during which such plastic synaptic learning occurs has been observed to be of the order ~100 ms.

The number of synapses also outnumber the number of neurons in the mammalian cortex by a large extent. It is crucial to accommodate as many synapses as possible per neuron for efficient implementation of a neuromorphic system capable of online learning. Although there have been several attempts to emulate synaptic functionality by CMOS transistors, the area overhead and power consumption involved is quite large due to the significant mismatch between the CMOS transistors and the underlying neuroscience mechanisms. As a result, nanoscale devices that emulate the functionality of such programmable, plastic, Hebbian synapses have become a crucial requirement for such neuromorphic computing platforms. To that end, researchers have proposed several programmable devices based on phase change materials, Ag—Si memristors, and chalcogenide memristors that mimic the synaptic functionality. Neuromorphic computing architectures employing such memristive devices have been also demonstrated. However, nanoscale devices attaining the ultra-high density ($10^{11}$ synapses per $cm^{-2}$) and low energy consumption (~1 pJ per synaptic event) of biological synapses have still remained elusive. Therefore, improvements are needed in the field.

SUMMARY

The present disclosure provides a device structure based on a ferromagnet with oppositely polarized magnetic domains separated by a transition region called a domain wall, referred to herein as a domain-wall magnet (DWM). The structure has decoupled spike transmission and learning current paths which allows a learning event to take place at any time during the operation of a connected neural network. Spin-orbit torque generated by the magnetic heterostructure generates STDP.

According to various aspects, an electronic synapse is disclosed, comprising a heavy metal layer having a high spin orbit coupling, a domain wall magnet layer having a bottom surface adjacent to a top surface of the heavy metal layer, the domain wall magnet layer having a perpendicular magnetic anisotropy, the domain wall magnet layer having a domain wall, the domain wall running parallel to a longitudinal axis of the domain wall magnet layer, a pinned layer having perpendicular magnetic anisotropy, and an oxide tunnel barrier connected between the domain wall magnet layer and the pinned layer, wherein the pinned layer, the oxide tunnel barrier, and the free layer form a magnetic tunnel junction.

The electronic synapse may further comprise a non-magnetic electrical contact having a bottom surface in contact with the top surface of the domain wall magnet layer, the non-magnetic electrical contact electrically isolated from the magnetic tunnel junction. The magnetic tunnel junction may be disposed near a first end of the domain wall magnet layer and the non-magnetic electrical contact is disposed near a second end of the domain wall magnet layer. The electronic synapse may further comprise a current source configured to supply a spike current from the pinned layer, through the magnetic tunnel junction, through the heavy metal layer to the non-magnetic electrical contact. The current source may also supply a learning current through the heavy metal layer from the first end of the heavy metal layer to the second end of the heavy metal layer to generate a spin orbit torque on the domain wall magnet layer, wherein the spike current and the learning current are decoupled.

BRIEF DESCRIPTION OF THE DRAWINGS

In the following description and drawings, identical reference numerals have been used, where possible, to designate identical features that are common to the drawings.

FIG. 1b is a diagram showing side views of the synapse structure of FIG. 1a.

FIG. 2a is diagram showing a resistance model of the synapse structure of FIG. 1a.

The attached drawings are for purposes of illustration and are not necessarily to scale.

DETAILED DESCRIPTION

In the following description, some aspects will be described in terms that would ordinarily be implemented as software programs. Those skilled in the art will readily recognize that the equivalent of such software can also be constructed in hardware, firmware, or micro-code. Because data-manipulation algorithms and systems are well known, the present description will be directed in particular to algorithms and systems forming part of, or cooperating more directly with, systems and methods described herein. Other aspects of such algorithms and systems, and hardware or software for producing and otherwise processing the signals involved therewith, not specifically shown or described herein, are selected from such systems, algorithms, components, and elements known in the art. Given the systems and methods as described herein, software not specifically shown, suggested, or described herein that is useful for implementation of any aspect is conventional and within the ordinary skill in such arts.

Figure 1A:
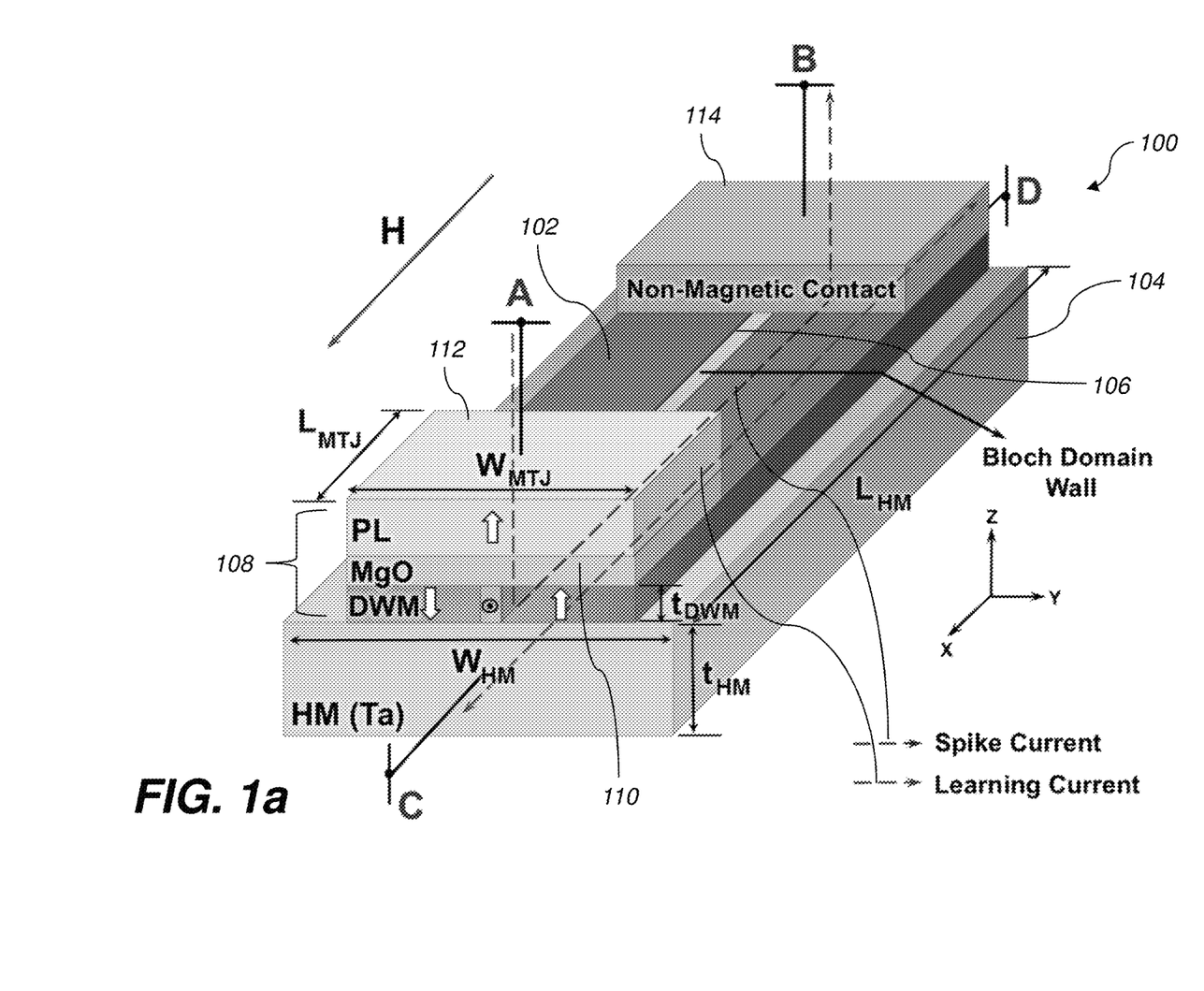
FIG. 1a is a diagram showing a perspective view of an electronic synapse structure according to various aspects.
Figure 1B:
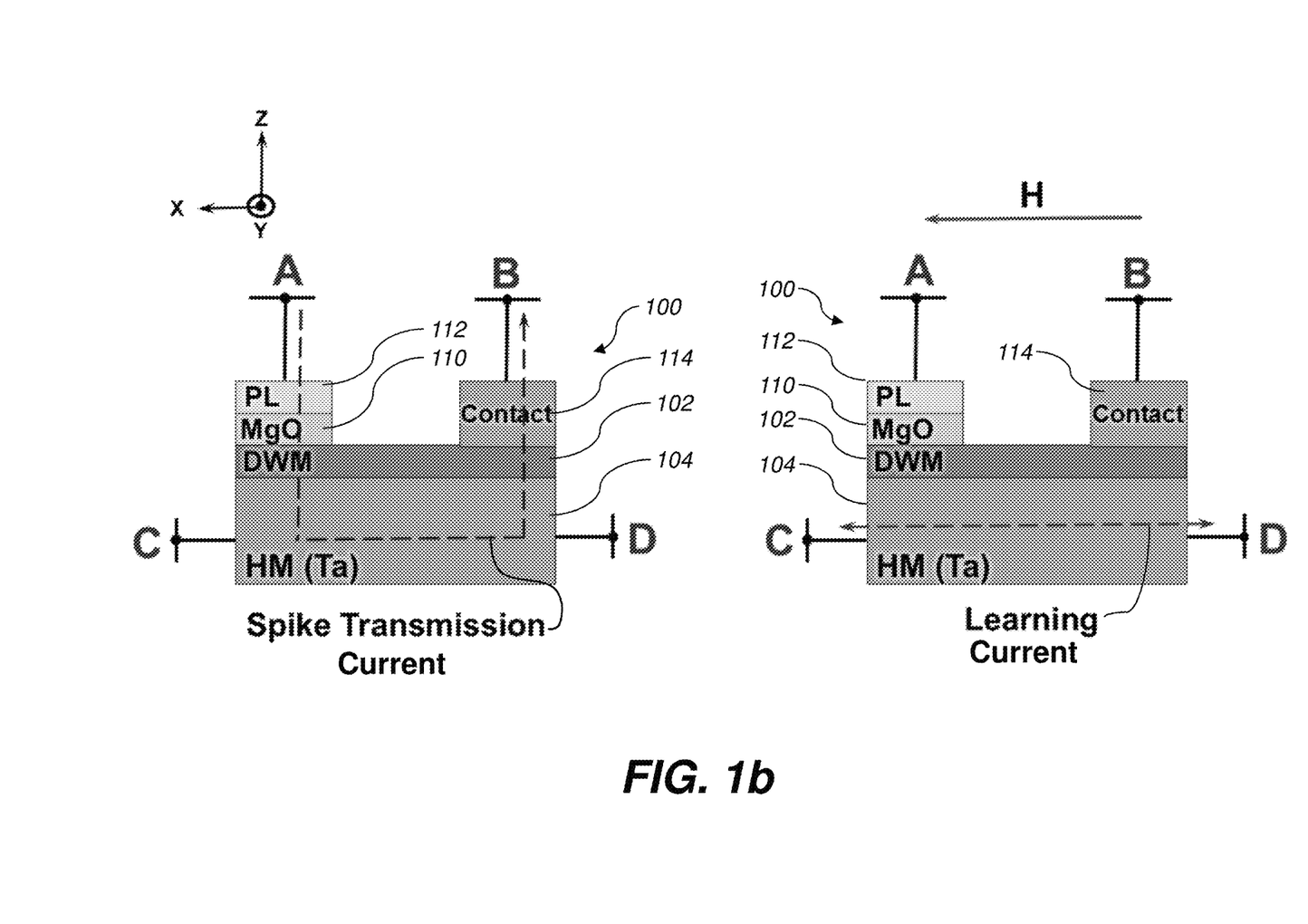

FIG. 1a shows an electronic synapse device 100 according to one embodiment of the present disclosure. As shown, the device 100 comprises a magnetic heterostructure having a domain wall magnet (DWM) layer 102 in contact with a non-magnetic heavy metal (HM) layer 104 with high spin-orbit coupling. The HM layer 104 may comprise beta-Tantalum, Tungsten, Platinum, or the like. The domain wall magnet 102 is formed from a ferromagnetic material with Perpendicular Magnetic Anisotropy (PMA) such as CoFe or CoFeB. The DWM 102 has a domain wall 106 which is longitudinal, running parallel to the length of the DWM 102. The magnetic domain regions of the DWM 102 on opposite sides of the domain wall 106 have opposite polarity, with the domain wall 106 providing a polarity transition region. The DWM 102 is also part of a Magnetic Tunneling Junction (MTJ) structure 108 having a tunneling oxide barrier 110 which separates the DWM from a Pinned Layer (PL) 112. The tunneling oxide barrier 110 may comprise MgO or other suitable oxide barrier material. The pinned layer 112 may comprise a ferromagnetic material such as CoFe or CoFeB. FIG. 1(b) depicts a side-view of the device 100.

In operation, a spike current from a pre-neuron (not shown) passes from terminal A (on PL 112) to terminal B (non-magnetic contact 114) through the MTJ structure 108 and the HM layer 104 as shown in FIG. 1a. Non-magnetic contact 114 may be formed from a non-magnetic electrically conductive material such as copper, gold, or the like. The learning current required to program the synapses flows through the HM 104 from terminal C to terminal D as shown in FIG. 1a to implement STDP learning. An in-plane magnetic field H is also applied during the learning stage. The magnetic field H may be applied by a current carrying wire disposed near the device 100 in certain embodiments, although other methods may be used. The spike transmission and learning operations are described below.

Figure 2A:
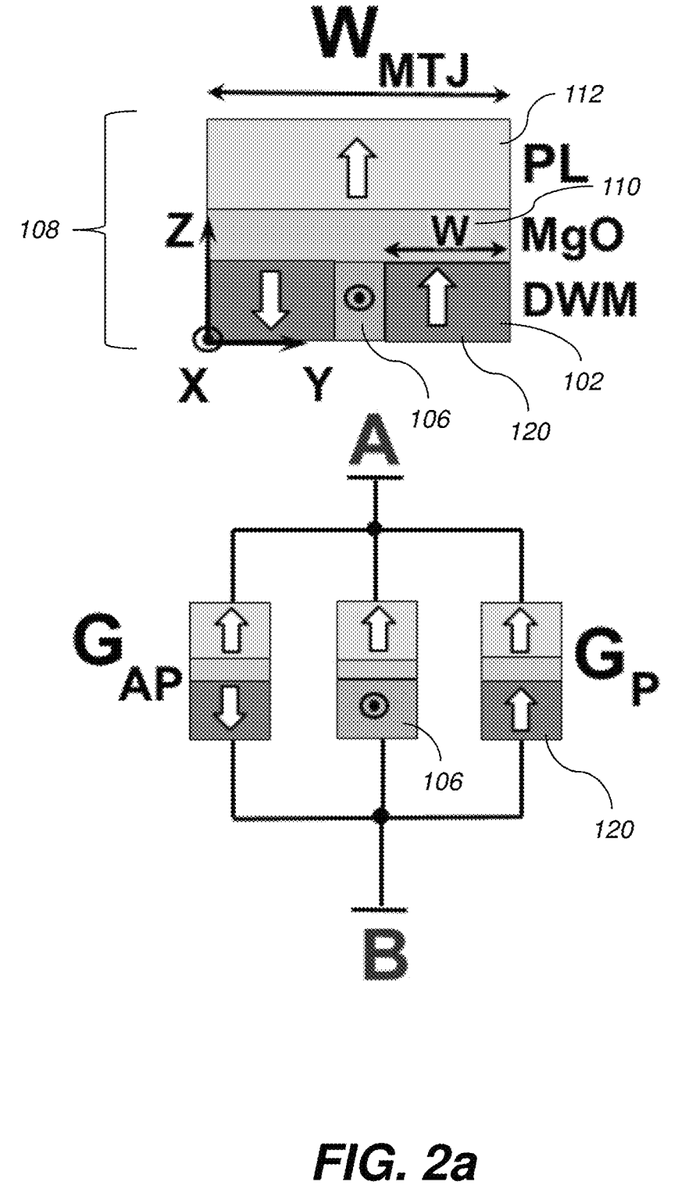
Figure 2B:
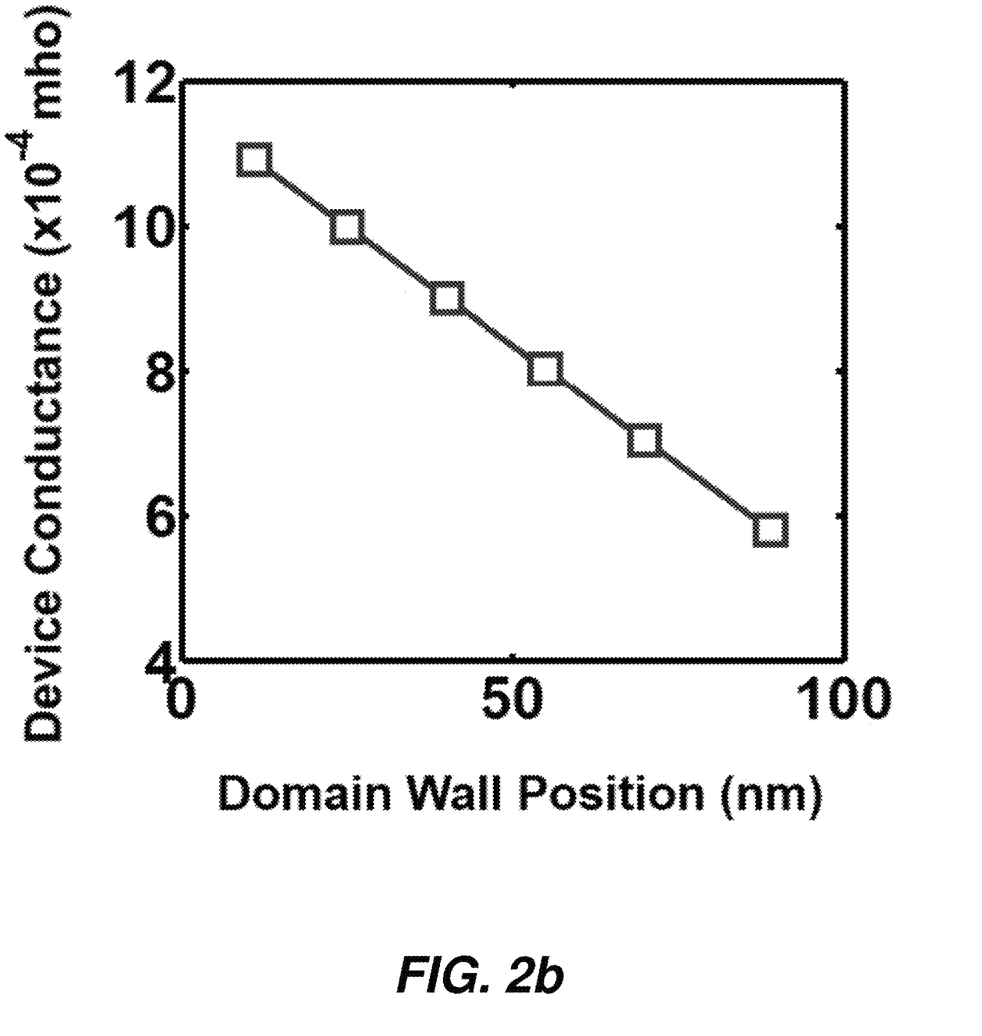
FIG. 2b is a plot showing variation of device conductance as a function of domain wall position for the synapse of FIG. 1a according to various aspects.

The resistance model of the device 100 is shown in FIG. 2a. Considering the total width of the MTJ 108 to be $W_{MTJ}$ and the width of the ferromagnetic domain 120 whose magnetization is parallel to the PL 112 to be w, the equivalent conductance of the device can be expressed as $$G_{dev} = G_{AP,max}\left(1 - \frac{w}{W_{MTJ}}\right) + G_{P,max}\left(\frac{w}{W_{MTJ}}\right) + G_{DW} \quad (1)$$

where $G_{AP,max}$ represents the conductance of the device when the entire DWM 102 magnetization is oriented anti-parallel to the PL 112, $G_{P,max}$ represents the conductance of the device when the entire DWM 102 magnetization is oriented parallel to the PL 112 and $G_{DW}$ represents the conductance of the domain wall 106. Hence, the device 100 conductance varies linearly with the domain wall 106 position as shown in FIG. 2b. FIG. 2b was generated using a non-equilibrium Green's function (NEGF) based electron transport simulation framework which was modified to simulate the variation of the device conductance with domain wall position.

The resistance of the DWM 102 and HM layer 104 heterostructure that lies in the path of the spike current between terminals A and B is negligible in comparison to the resistance of the tunneling oxide barrier 110. Hence, when a voltage spike from the pre-neuron is applied between terminals A and B, the device conductance will determine the strength of the spike current transmitted which can be modulated by programming the domain wall 106 position.

In order to implement STDP in the device 100, a current is passed between terminals C and D using a current source (not shown). When a programming current flows from terminal C to terminal D through the HM layer 104 in the −x direction, the spin-Hall effect leads to the accumulation of +y directed spin-polarized electrons at the interface between the HM layer 104 and the DWM layer 102, thereby generating spin-orbit torque on the DWM layer 102. Negligible Dzyaloshinskii-Moriiya Interaction (DMI) and shape anisotropy due to the formation of the longitudinal domain wall 106 leads to the formation of a Bloch wall in the sample. The external in-plane magnetic field H orients the magnetic moment of the domain wall 106 along ±x direction. Thus, the final magnetization state of the DWM 102 is determined by the cross-product of the accumulated spins at the interface (between the HM layer 104 and DWM layer 102) and the direction of the applied magnetic field H. For a magnetic field H applied along the +x direction, application of current through the HM 104 in the −x direction results in a domain wall motion in the −y direction so that +z magnetic domain in the DWM 102 starts to expand. Note that conventional bulk spin-transfer torque does not contribute to the domain wall 106 movement.

The magnetization dynamics of the DWM 102 can be described by solving the Landau-Lifshitz-Gilbert equation with an additional term to account for the spin momentum torque generated by the accumulated spin current at the interface between the HM layer 104 and the DWM layer 102 as follows:

$$\frac{d\hat{m}}{dt} = -\gamma(\hat{m} \times H_{\mathit{eff}}) + \alpha\left(\hat{m} \times \frac{d\hat{m}}{dt}\right) + \beta(\hat{m} \times \hat{m}p \times \hat{m}) \quad (2)$$

where $\hat{m}$ is the unit vector of DWM 102 magnetization at each grid point, $\gamma$ is the gyromagnetic ratio for electron, $\alpha$ is Gilbert's damping ratio, $H_{\mathit{eff}}$ is the effective magnetic field, h is Plancks constant, P is polarization of the PL, J is input charge current density, $\theta$ is spin-orbit torque efficiency, $\mu_0$ is permeability of vacuum, e is electronic charge, t is the DWM layer 102 (free layer) thickness and Ms is saturation magnetization and $\hat{m}p$ is the direction of input spin current. To test the illustrated example, micromagnetic simulations were performed using MuMax3 software. The simulation parameters are given in Table I and were used in the examples below, unless otherwise stated.

TABLE I

Simulation Parameters

| Parameters | Value |
| --- | --- |
| Ferromagnet Dimensions | 200 × 100 × 1 nm³ |
| Grid Size | 2 × 2 × 1 nm³ |
| Heavy Metal Dimensions | 200 × 1000 × 10 nm³ |
| Domain Wall Width | 22 nm |
| MTJ (PL) Dimensions | 120 × 100 × 1 nm³ |
| Saturation Magnetization, $M_s$ | 800 KA/m |
| Spin Orbit Torque Efficiency, $\theta$ | 0.08 |
| Gilbert Damping Factor, $\alpha$ | 0.024 |
| MgO Thickness | 1.2 nm |
| Exchange Correlation Constant | $3 \times 10^{-11}$ J/m |
| Perpendicular Magnetic Anisotropy | $6 \times 10^5$ J/m⁻³ |
| Magnetic Field, H | 10 G |

Figure 3A:
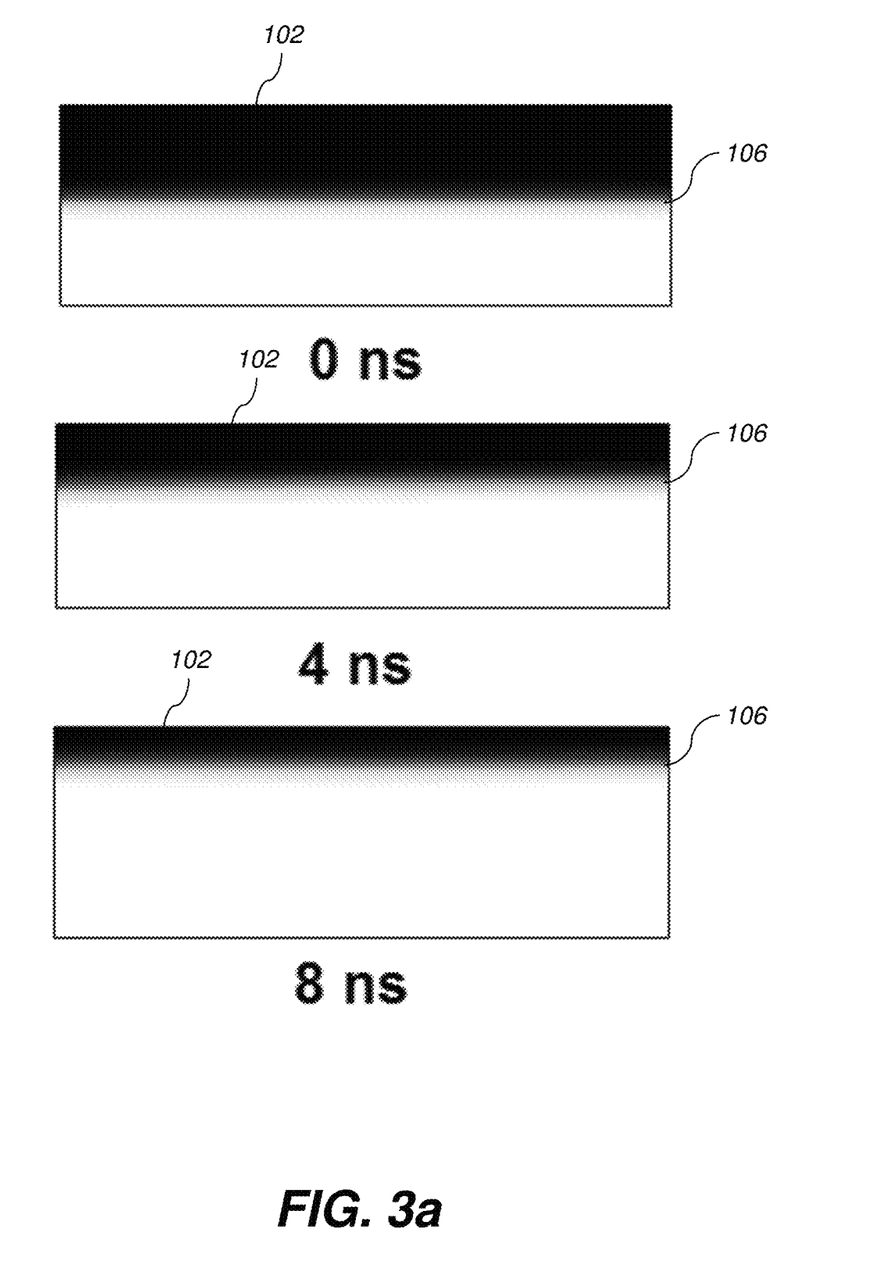
FIG. 3a is a diagram illustrating position of the domain wall in Ta—CoFeB heterostructure with CoFeB dimensions of 600×200×1 nm$^3$ as a function of time, due to the application of a current density of J=3.5×106 A/cm$^2$ according to various aspects.

The simulation framework was calibrated with experimental results reported for a Ta (HM)—CoFeB (DWM) heterostructure. FIG. 3a depicts the position of the domain wall 106 in the sample DWM 102 with CoFeB dimensions of 600×200×1 nm³ as a function of time (at times 0 ns, 4 ns, and 8 ns), due to the application of a current density of J=3.5×106 A/cm².

Figure 3B:
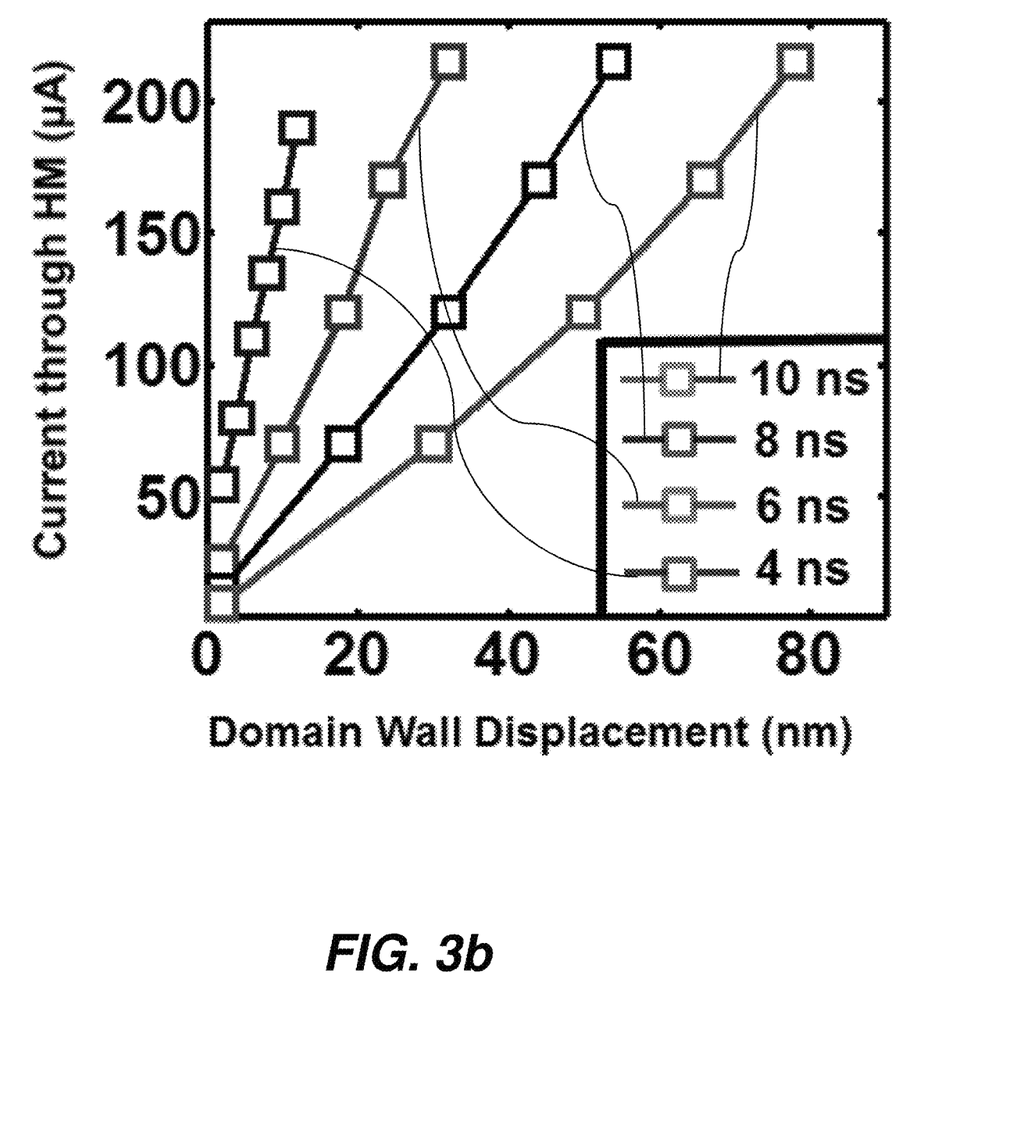
FIG. 3b is a plot showing variation of domain wall displacement with programming current through the heavy metal of the electronic synapse for different programming time durations according to various aspects.

For a given duration of the programming current, the domain wall 106 displacement increases linearly with the magnitude of the current density. FIG. 3b illustrates the linear increase of the domain wall 106 displacement with programming current amplitude for different time durations.

Since the device 100 conductance is also a linear function of the domain wall 106 position, the learning current follows a linear relationship with conductance change in the device. Reversing the direction of learning current or the direction of the magnetic field H causes the domain wall 106 to move in an opposite direction. This enables STDP to be implemented in the device 100 as discussed below.

Figure 4A:
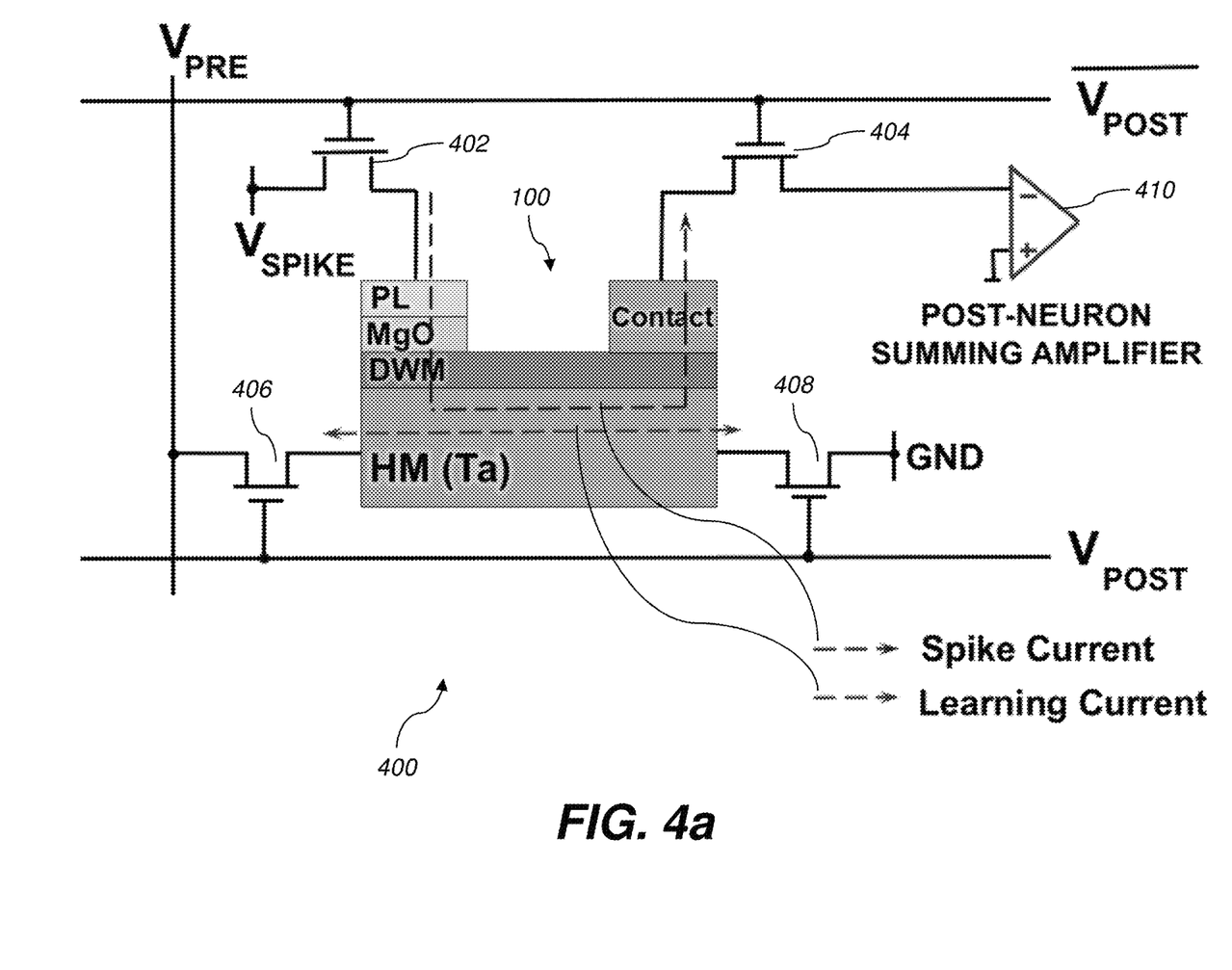
FIG. 4a is a schematic diagram illustrating a synaptic device with access transistors for separate spike transmission and learning current paths according to various aspects.
Figure 4B:
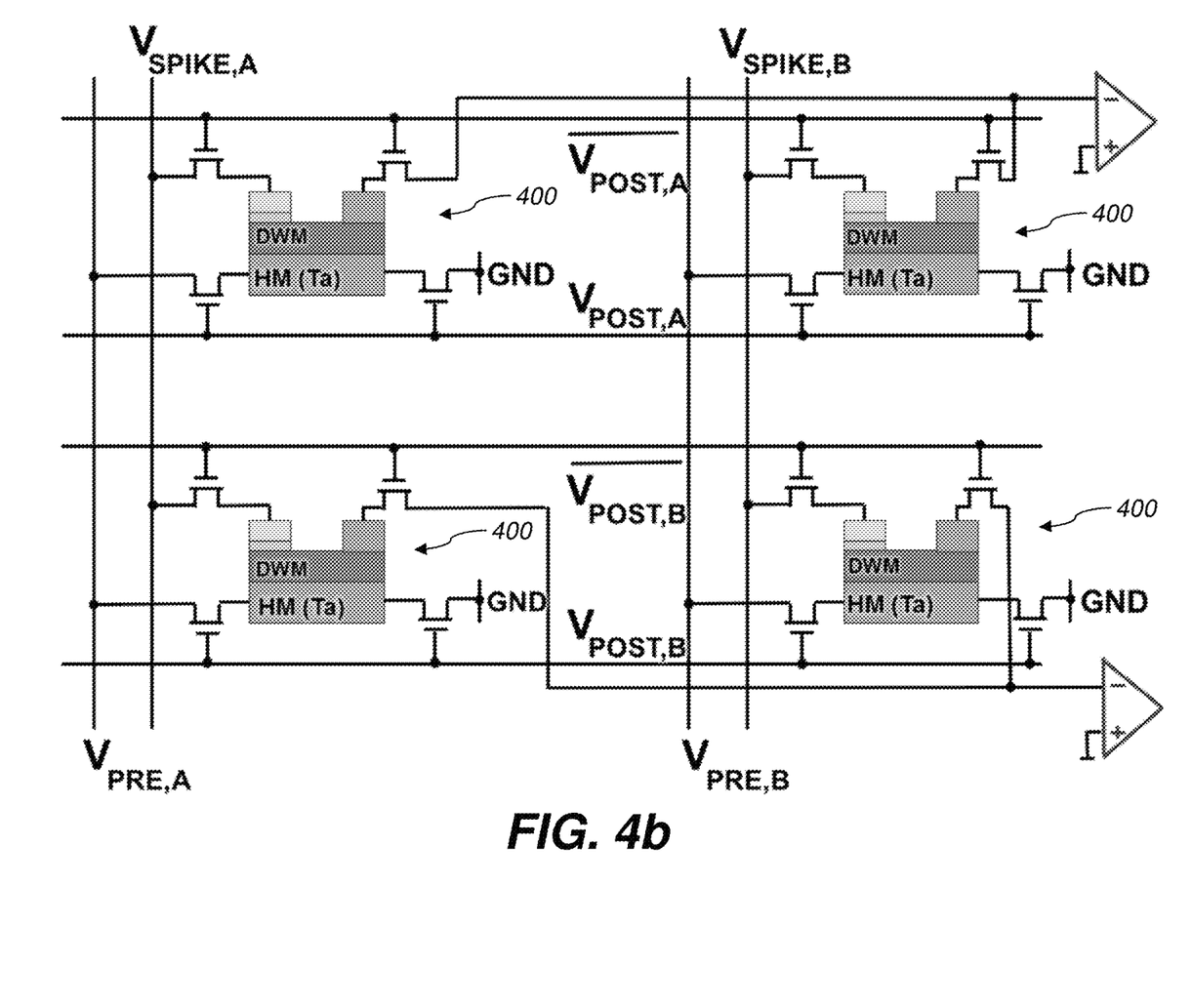
FIG. 4b is a schematic diagram illustrating an arrangement of electronic synapses in an array according to various aspects.

FIG. 4a shows an electronic synaptic device 400 according to one embodiment with access transistors 402, 404, 406 and 408 to decouple the spike transmission and learning current paths, and a post-neuron summing amplifier 410. A possible arrangement of the synaptic devices 400 in an array connecting the pre-neurons and post-neurons is depicted in FIG. 4b. The spike current transmission signal from the pre-neuron is $V_{SPIKE}$ while the learning current signals from $V_{PRE}$ and $V_{POST}$ are used to implement STDP. When the pre-neuron spikes, the spike current is transmitted using the signal $V_{SPIKE}$ through the MTJ structure 108 and out the non-magnetic contact to transistor 404. As long as the post-neuron does not spike, the spike transmission current path remains activated, since the control inputs (gates) of the transistors 402 and 404 are connected to a voltage signal which is the complement of $V_{POST}$. Assuming that the resistance offered by the access transistors 402 and 404 in the spike transmission current path is small in comparison to the resistance of the device 100, the spike voltage will be modulated by the device 100 conductance and the weighted spike current will be transmitted to the post-neuron summing amplifier 410. As soon as the pre-neuron spikes, it also applies an appropriate programming voltage $V_{PRE}$ which extends over the time window to be used for learning. When the post-neuron spikes, the $V_{POST}$ signal gets activated. The $V_{POST}$ signal is a short pulse of a few nanosecond duration that essentially samples the appropriate amount of learning current from the $V_{PRE}$ signal. The spike transmission path gets deactivated and the appropriate learning current corresponding to the time delay between the pre-neuron and post-neuron spikes passes through the HM layer 104 to move the domain wall 106 to the appropriate location. To account for learning during the negative timing window, the post-neuron programming signal $V_{POST}$ can be applied with a delay corresponding to the duration of the negative time window. In the illustrated embodiment, the $V_{POST}$ signal was taken to be of duration 10 ns. Once the $V_{POST}$ signal is activated, learning current flows through the device 100 in case the $V_{PRE}$ signal remains active. Assuming that the magnetic field H required for learning is generated by a local current carrying wire, the current through the wire can be turned on only when the post-neuron spikes. Hence spin-orbit torque is the underlying physical phenomena involved in the learning process as conventional bulk spin-transfer torque will not have any effect on the longitudinal domain wall 106. Note that some amount of spike current will flow through the PL 112 of the MTJ 108 and the HM layer 104. The spin current injected into the DWM 102 due to spike current flowing through the HM layer 104 is much larger than the spin current injected due to the PL 112 as the spin injection efficiency of spin-Hall effect is much greater than the polarization of the PL 112. However, the spike generation and post-neuron summing amplifier circuits shown in FIGS. 4a and 4b can be appropriately designed such that the magnitude of the spike current is kept lower than the threshold current density required for domain wall movement to avoid any change in synaptic conductance.

Figure 5A:
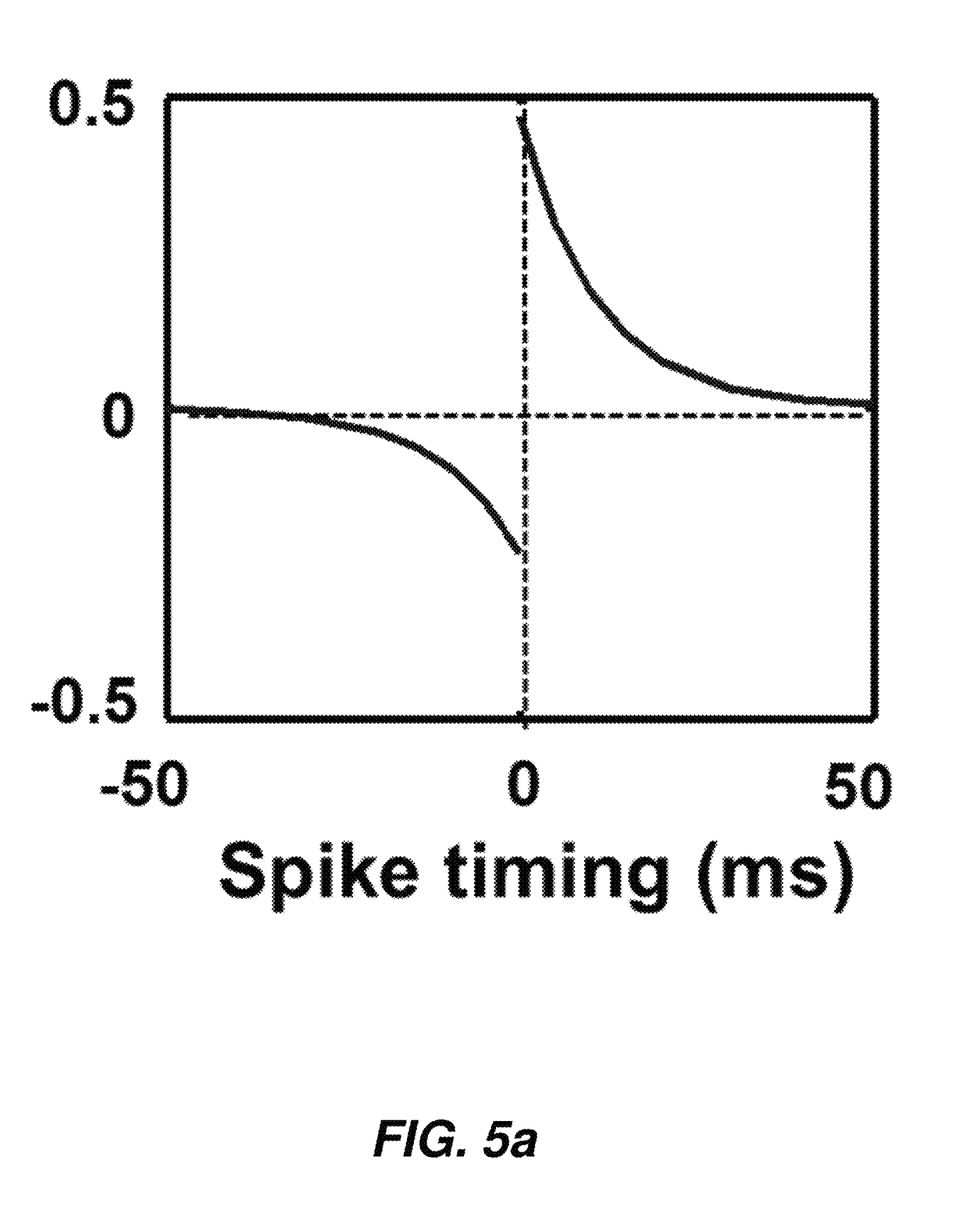
FIG. 5a is a plot showing relative conductance change of the synapse of FIG. 1a as a function of spike timing.
Figure 5B:
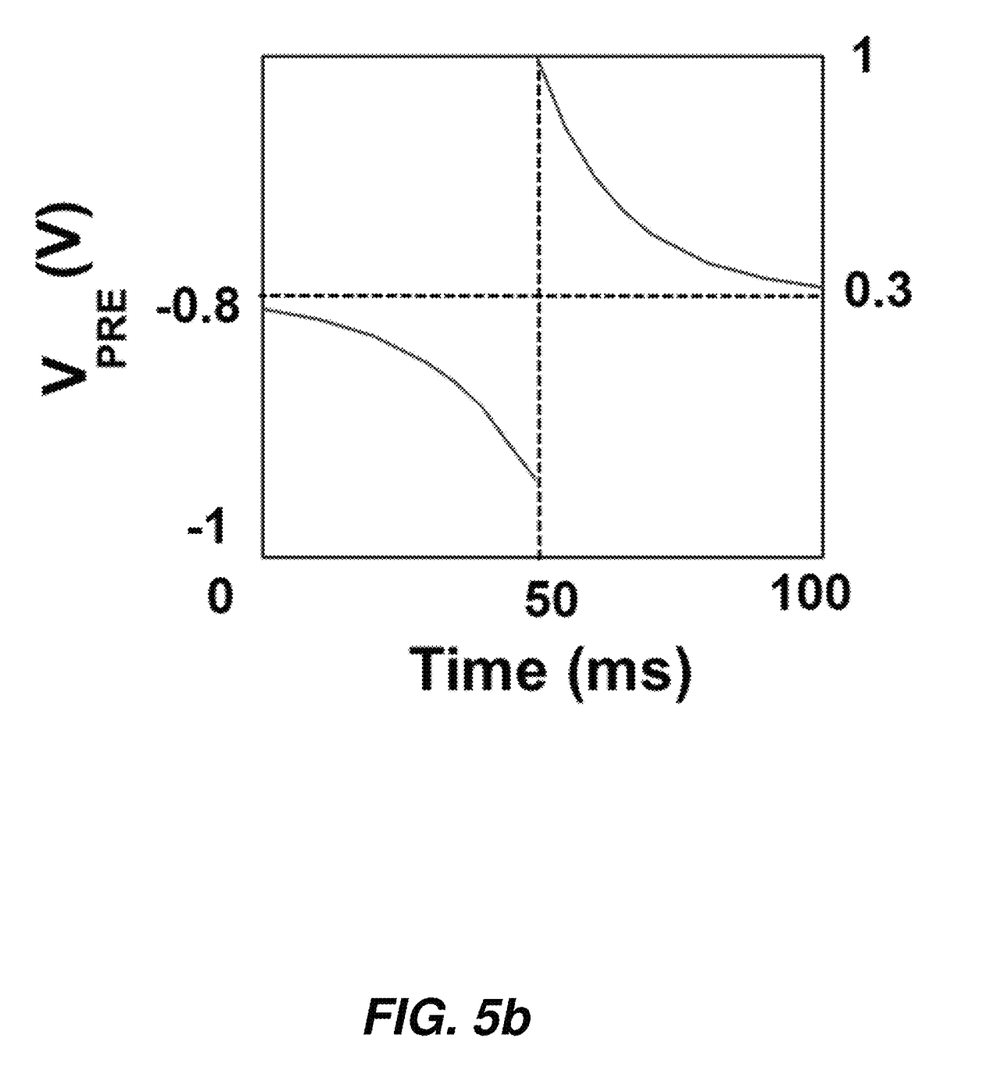
FIG. 5b is a plot showing $V_{PRE}$ programming signal as a function of time for a pre-neuron spiking event at t=0 for the synapse device of FIG. 1a according to various aspects.

FIG. 5a depicts the STDP characteristics (relative conductance change as a function of spike timing difference) implemented in a test device (similar to device 100) which are in accordance to the characteristics measured in rat hippocampal glutamatergic synapses. Simulation of the programming circuit with access transistors was done using a commercial 45 nm transistor model. The pre-neuron signal $V_{PRE}$ required to achieve the desired STDP characteristics is shown in FIG. 5b. For a time duration of 10 ns, the amount of programming current required to switch the DWM from the completely parallel to the anti-parallel state or vice-versa was found to be ~200 µA. Assuming that this current flows from a 1V supply, the corresponding energy consumption is ~2 pJ (V×I×t). The desired programming current was achieved by appropriately sizing the access transistors for learning.

The magnetic field along +x direction can be produced by a current flowing along +y direction through a wire located at a height h from the device. The magnitude of the magnetic field B produced by a current $I_{field}$ is given by Biot-Savart's Law as $$B = \frac{\mu_0 I_{field}}{2\pi h} \quad (3)$$

For instance, for a magnetic field B=10 G and height h=100 nm, the current $I_{field}$ required is ~500 µA. This field current can be utilized to provide the necessary magnetic field H for all the synapses in a particular row of the array. The number of synapses that can be driven by the field current will be limited by the resistance of the wire. Hence the average energy consumption per synapse for magnetic field generation will be given by 5 pJ/N where N is the number of synapses in a particular row of the array. Additionally, a ferromagnet cladding region with high permeability can be used to enhance and concentrate the magnetic field, thereby causing an increase of magnetic field strength by almost ~13× for a given magnitude of field current. Such narrow gap cladding (NGC) field enhancement techniques not only helps to reduce the power consumption of the field current but also helps to provide immunity against any noise that may arise from stray magnetic fields of neighboring magnets. Hence, in certain embodiments the energy consumption due to magnetic field generation can be limited to sufficiently low values in comparison to the programming energy consumption of the synapse by appropriate design.

Various aspects described herein may be embodied as systems or methods. Accordingly, various aspects herein may take the form of an entirely hardware aspect, an entirely software aspect (including firmware, resident software, micro-code, etc.), or an aspect combining software and hardware aspects These aspects can all generally be referred to herein as a "service," "circuit," "circuitry," "module," or "system."

The invention is inclusive of combinations of the aspects described herein. References to "a particular aspect" and the like refer to features that are present in at least one aspect of the invention. Separate references to "an aspect" (or "embodiment") or "particular aspects" or the like do not necessarily refer to the same aspect or aspects; however, such aspects are not mutually exclusive, unless so indicated or as are readily apparent to one of skill in the art. The use of singular or plural in referring to "method" or "methods" and the like is not limiting. The word "or" is used in this disclosure in a non-exclusive sense, unless otherwise explicitly noted.

The invention has been described in detail with particular reference to certain preferred aspects thereof, but it will be understood that variations, combinations, and modifications can be effected by a person of ordinary skill in the art within the spirit and scope of the invention.

The invention claimed is:

1. An electronic synapse, comprising:
   a) a heavy metal layer;
   b) a domain wall magnet layer having a bottom surface adjacent to a top surface of the heavy metal layer, the domain wall magnet layer having a perpendicular magnetic anisotropy, the domain wall magnet layer having a domain wall, the domain wall running parallel to a longitudinal axis of the domain wall magnet layer;
   c) a pinned layer having perpendicular magnetic anisotropy;
   d) an oxide tunnel barrier connected between a top surface of the domain wall magnet layer and a bottom surface of the pinned layer, wherein the pinned layer, the oxide tunnel barrier, and the domain wall magnet layer form a magnetic tunnel junction; and
   e) a non-magnetic electrical contact having a bottom surface in contact with the top surface of the domain wall magnet layer, the non-magnetic electrical contact electrically isolated from the magnetic tunnel junction.

2. The electronic synapse of claim 1, wherein a bottom surface of the oxide tunnel barrier of the magnetic tunnel junction is attached to a first end of the top surface of the domain wall magnet layer and the non-magnetic electrical contact is attached to a second end of upper surface of the domain wall magnet layer.

3. The electronic synapse of claim 2, further comprising a current source, the current source configured to:
   a) supply a spike current from the pinned layer, through the magnetic tunnel junction, through the heavy metal layer to the non-magnetic electrical contact; and
   b) supply a learning current through the heavy metal layer from the first end of the heavy metal layer to the second end of the heavy metal layer to generate a spin orbit torque on the domain wall magnet layer, wherein the spike current and the learning current are decoupled.

* * * * *